(12) United States Patent
Kajigaya

(10) Patent No.: US 8,520,449 B2
(45) Date of Patent: Aug. 27, 2013

(54) SEMICONDUCTOR DEVICE AND CONTROL METHOD THEREOF

(75) Inventor: Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 167 days.

(21) Appl. No.: 13/137,745

(22) Filed: Sep. 9, 2011

(65) Prior Publication Data

US 2012/0063241 A1 Mar. 15, 2012

(30) Foreign Application Priority Data

Sep. 14, 2010 (JP) .................................. 2010-206127

(51) Int. Cl.
*G11C 7/00* (2006.01)
(52) U.S. Cl.
USPC ......... 365/189.04; 365/63; 365/206; 365/207
(58) Field of Classification Search
USPC ................. 365/189.04, 63, 206, 207
See application file for complete search history.

(56) References Cited

U.S. PATENT DOCUMENTS

| 6,937,535 B2* | 8/2005 | Ahn et al. ...................... 365/222 |
| 7,460,388 B2* | 12/2008 | Ilda .................................. 365/63 |
| 7,697,358 B2 | 4/2010 | Kajigaya |
| 8,374,044 B2* | 2/2013 | Narui .......................... 365/210.1 |

FOREIGN PATENT DOCUMENTS

JP 2008-262632(A) 10/2008

* cited by examiner

*Primary Examiner* — Son Dinh
(74) *Attorney, Agent, or Firm* — McGinn IP Law Group, PLLC

(57) ABSTRACT

A semiconductor device has a hierarchical bit line structure and comprises first and second local bit lines transmitting first and second signals of first and second memory cells corresponding to a selected word line, and first and second global bit lines electrically connected to the first and second local bit lines through first and second switches, first and second sense amplifiers connected to the first and second global bit lines, and a control circuit. During a first period after the first and second memory cells are simultaneously accessed, the control circuit controls the first switch to conduction state so that the first sense amplifier amplifies the first signal and controls the second switch to non conduction state. During a second period after sensing of the first sense amplifier finishes, the control circuit controls the second switch to conduction state so that the second sense amplifier amplifies the second signal.

20 Claims, 10 Drawing Sheets

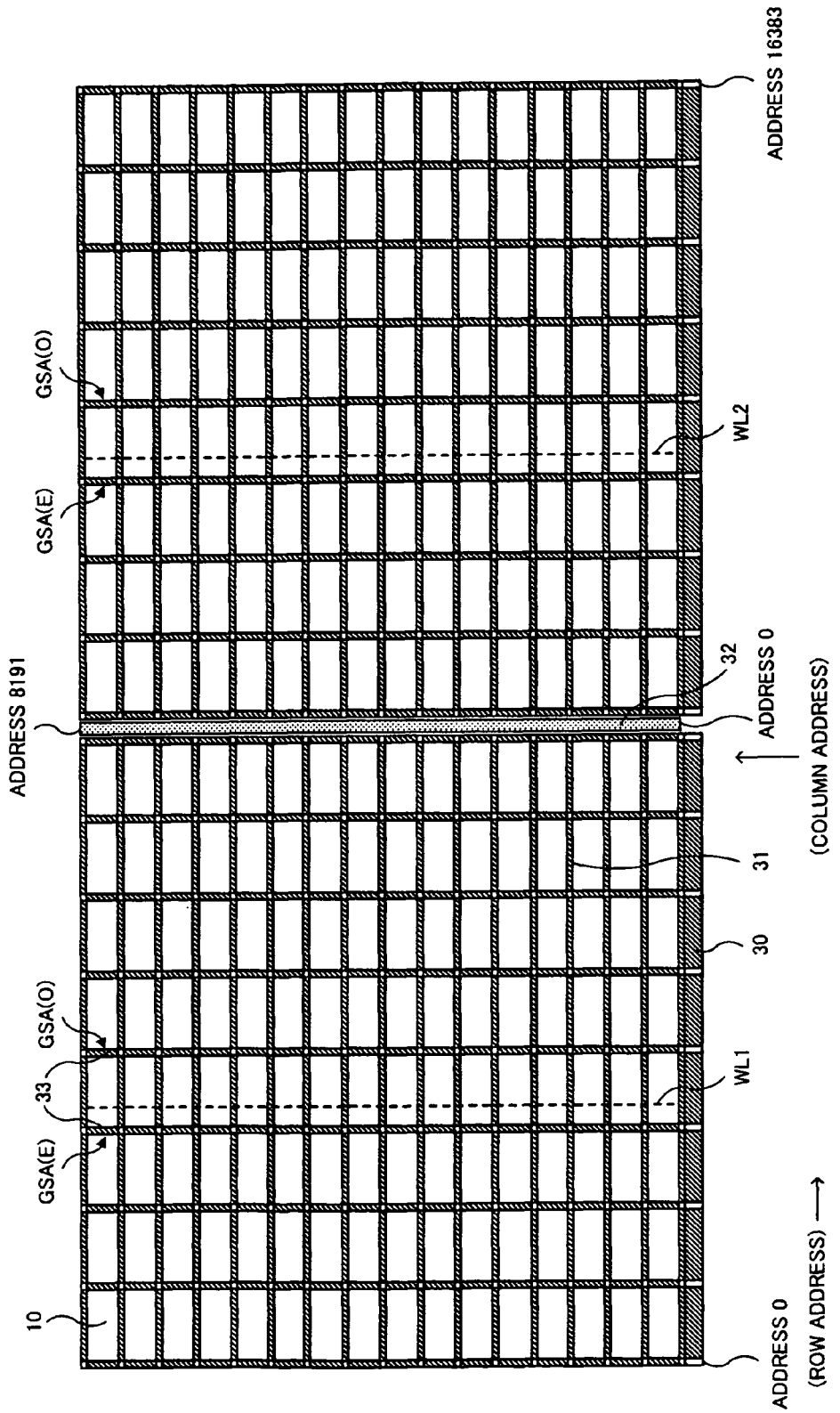

SEMICONDUCTOR DEVICE AND CONTROL METHOD THEREOF

BACKGROUND OF THE INVENTION

1. Field of the Invention

The present invention relates to a semiconductor device comprising a memory cell array having a bit line structure hierarchized using global bit lines and local bit lines, and a control method thereof.

2. Description of Related Art

In recent years, miniaturization of a memory cell array has been achieved in semiconductor devices such as DRAM, and thus in order to overcome a performance problem caused by an increase in the number of memory cells connected to a bit line, a configuration in which the bit lines are hierarchized into global bit lines and local bit lines has been proposed (for example, refer to Japanese Patent Application Laid-open No. 2008-262632 (U.S. Pat. No. 7,697,358 B2)). It is required to reduce memory cell size to, for example, 6F2 or 4F2 ("F" is minimum manufacturing scale), and the bit line pitch in this case needs to be'set to 2F that is a manufacturing limit. In general, when employing the hierarchical bit line structure, a plurality of global bit lines arranged with a predetermined pitch are alternately connected to a plurality of global sense amplifiers placed on both sides (both ends) thereof, and N local bit lines corresponding to N segments into which each global bit line is partitioned in its extending direction are arranged. Further, it is difficult to arrange sense amplifiers so that they adapt to the reduced bit line pitch, and therefore an arrangement in which a plurality of sense amplifiers are alternately arranged at both ends of the global bit lines is effective (so-called zigzag alignment).

However, even when employing the hierarchical bit line structure, it is inevitable that a ratio of coupling capacitance between adjacent bit lines to overall bit line capacitance increases by reducing the bit line pitch to around 2F. Then, coupling noise between the adjacent bit lines remarkably increases due to influence of the coupling capacitance between the adjacent bit lines that is combined with a reduction in memory cell capacitance of the memory cell. Accordingly, there arises a problem that when a signal voltage read out from a memory cell by selecting a word line is sensed and amplified by a sense amplifier, the coupling noise between the adjacent bit lines increases so that sensing margin of the sense amplifier decreases.

SUMMARY

One of aspects of the invention is a semiconductor device comprising: a first local bit line transmitting a first signal of a first memory cell corresponding to a selected word line; a first global bit line electrically connected to the first local bit line through a first switch; a first sense amplifier connected to the first global bit line; a second local bit line transmitting a second signal of a second memory cell corresponding to the selected word line; a second global bit line electrically connected to the second local bit line through a second switch; a second sense amplifier connected to the second global bit line; and a control circuit controlling the first and second sense amplifiers and the first and second switches. In the semiconductor device of the invention, during a first period after the first and second memory cells are simultaneously accessed by activating the selected word line, the control circuit controls the first switch to a conduction state so that the first sense amplifier amplifies the first signal and controls the second switch to a non conduction state, and during a second period after sensing of the first sense amplifier finishes in the first period, the control circuit controls the second switch to a conduction state so that the second sense amplifier amplifies the second signal.

According to the semiconductor device of the invention, when the selected word line is driven in a read operation of the semiconductor device, the first signal is amplified by the first sense amplifier through the first local bit line, the first switch and the first global bit line during the first period, and the second signal is amplified by the second sense amplifier through the second local bit line, the second switch and the second global bit line during the second period. At this point, the second switch is controlled to a non conduction state during the first period. Thus, the respective sense amplifiers attached to the first and second global bit lines operate at timings different from each other, and therefore it is possible to suppress coupling noise therebetween.

For example, when a memory cell array including the first and second global bit lines being alternately arranged is configured and the first and second sense amplifiers are arranged in a zigzag manner, the coupling noise between even-numbered and odd-numbered global bit lines can be reliably suppressed, which is effective in case of reducing the bit line pitch due to the miniaturization. Then, the first and second potential supplying circuits that supply a fixed potential to the global bit lines function as shielding lines, thereby further suppressing the coupling noise.

Further, another aspect of the invention is a control method of a semiconductor device, the method comprising: accessing first and second memory cells simultaneously using one word line in a first step (period); transmitting data of the first memory cell to a first local bit line and transmitting the data of the first memory cell to a first global bit line through the first local bit line, and transmitting data of the second memory cell to a second local bit line and not transmitting the data of the second memory cell to a second global bit line corresponding to the second local bit line, in a second step (period) after the first step; sensing the data of the first memory cell using a first sense amplifier through the first global bit line in a third step (period) after the second step; transmitting he data of the second memory cell to the second global bit line through the second local bit line in a fourth step (period) after the third step; and sensing the data of the second memory cell using a second sense amplifier through the second global bit line in a fifth step (period) after the fourth step.

As described above, according to the invention, when the coupling capacitance between adjacent bit lines increases due to the miniaturization of the manufacturing scale, the coupling noise between the adjacent bit lines can be sufficiently suppressed by, for example, amplifying respective signals of two memory cells at different timings in temporally divided two operations (during first and second read periods) using corresponding sense amplifiers in the read operation. Therefore, an effect of improving sensing margin of the sense amplifier can be obtained. Meanwhile, when externally input data is written into the memory cells, writing operation is performed after the amplifying operations thereof during the first and second read periods, and thus an effect of preventing influence of the coupling noise between the adjacent bit lines can be obtained.

Further, when the sense amplifiers arranged in a zigzag manner are connected to input/output lines, respective sense amplifiers on both sides of the memory cell array can be independently connected to different input/output lines, and thus it is possible to suppress mutual influences of amplifying operations in which respective data of the sense amplifiers are read out at different timings. Furthermore, two word lines corresponding to row addresses of which a predetermined bit is different from each other are simultaneously selected, activation timings of the sense amplifiers are controlled in response to the predetermined bit, and thus an effect of maintaining compatibility with general DRAMs can be obtained.

As described above, the configuration of the invention is effective for the semiconductor device having the hierarchical bit line structure with the miniaturization of manufacturing scale, particularly in which, an open bit line structure or a single-ended configuration is applied to the memory cell array. In this case, the coupling noise between adjacent global bit lines can be small while reducing the bit line capacitance of each global bit line. Therefore, even if the memory cell capacitance is reduced due to the miniaturization, it is possible to achieve a large capacity semiconductor device capable of obtaining sufficient sensing margin. Further, the invention can be applied to a configuration in which each global sense amplifier is shared by memory cell arrays adjacent to each other, and thereby it is possible to improve the sensing margin without an increase in chip area.

BRIEF DESCRIPTION OF THE DRAWINGS

The above featured and advantages of the present invention will be more apparent from the following description of certain preferred embodiments taken in conjunction with the accompanying drawings, in which:

FIG. 10 is a diagram showing a schematic configuration of a memory bank in the DRAM of a fourth embodiment, which is configured using the memory cell arrays of the third embodiment (FIG. 9).

DETAILED DESCRIPTION OF THE PREFERRED EMBODIMENTS

A typical example of a technical idea solving the problems of the present invention will be shown below. However, it goes without saying that the present invention is not limited to the example of the technical idea and should be construed based on the disclosure of the claims.

As shown in FIG. 1, an example of the technical idea of the invention is applied to a semiconductor device having a bit line structure hierarchized using global bit lines GBL and local bit lines LBL. By selecting a common word line (not shown) for one local bit line LBL1 and the other local bit line LBL2, corresponding memory cells thereof are simultaneously accessed. When reading signals from the memory cells corresponding to the selected word line, a first signal is transmitted to the one local bit line LBL1 and a second signal is transmitted to the other local bit line LBL2. The global bit lines GBL and the local bit lines LBL are electrically connected to each other by switches SW1 and SW2. The one local bit line LBL1 is selectively connected to one global bit line GBL1 through the switch SW1, and the other local bit line LBL2 is selectively connected to the other global bit line GBL2 through the switch SW2. A sense amplifier SA1 is connected to one end of the one global bit line GBL1 (left side of FIG. 1), and a sense amplifier SA2 is connected to one end of the other global bit line GBL2 (right side of FIG. 1). It is preferable to arrange the sense amplifiers SA1 and SA2 of FIG. 1 alternately (zigzag alignment), without being particularly limited thereto.

As shown in FIG. 1, the global bit lines GBL and the local bit lines LBL correspond to respective layers of a substrate (for example, a silicon substrate). For example, the local bit lines LBL correspond to a diffusion layer and the global bit lines GBL correspond to a metal layer.

Figure 1A:
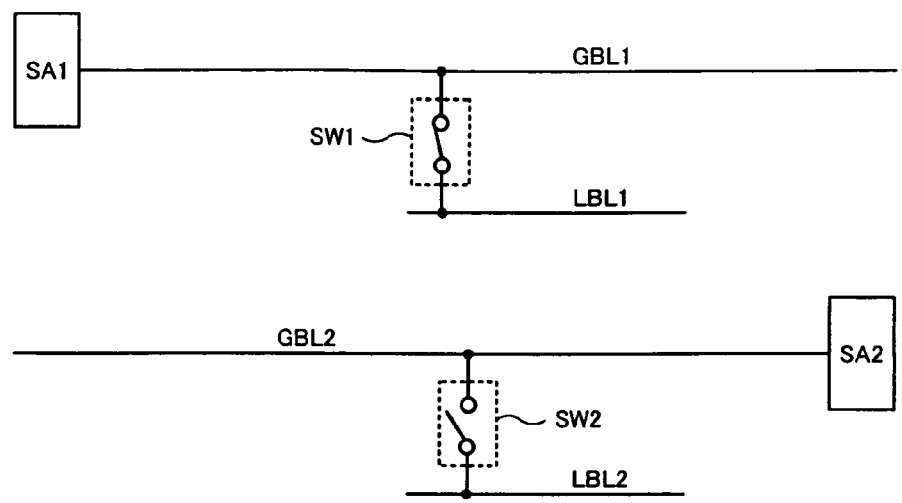
FIG. 1 is a principle diagram showing a technical idea of the invention.
Figure 1B:
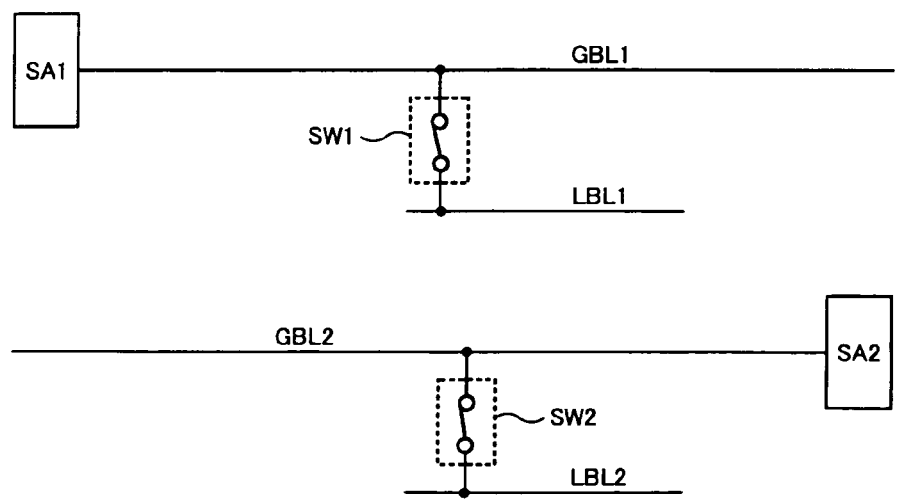

As shown in FIG. 1A, during a first period after the word line (not shown) is selected (activated), the local bit line LBL1 and the global bit line GBL1 are electrically connected to each other by turning on the switch SW1. That is, data of a first memory cell connected to the local bit line LBL1 that is selected by the word line is transmitted to the global bit line GBL1. Then, a signal transmitted through the global bit line GBL1 from the first memory cell is amplified by the sense amplifier SA1. At this point, the switch SW2 remains off. Further, as shown in FIG. 1B, when driving the selected word line, during a second period after a predetermined time is elapsed from the first period (after sensing by the sense amplifier SA1), the local bit line LBL2 and the global bit line GBL2 are electrically connected to each other by turning on the switch SW2. That is, data of a second memory cell connected to the local bit line LBL2 that is selected by the word line is transmitted to the global bit line GBL2. Then, a signal transmitted through the global bit line GBL2 is amplified by the sense amplifier SA2. Thus, amplifying operations of the two sense amplifiers SA1 and SA2 are performed at different timings. It is possible to suppress influence of mutual coupling noise occurring when the two global bit lines GBL1 and GBL2 are transitioned to potentials different from each other at the same time (the same period) by the corresponding sense amplifiers SA1 and SA2, respectively. When the global bit line GBL1 is sensed by the sense amplifier SA1, the global bit line GBL2 being maintained non-conductive by the switch S2 has not been sensed by the sense amplifier SA2 yet. Thus, the global bit line GBL1 is not affected by the transition of the potential of the global bit line GBL2 due to that the global bit line GBL2 is independently operated. On the other hand, when the global bit line GBL2 is sensed by the sense amplifier SA2, the sensing of the global bit line GBL1 has completed or almost reached a completion phase. Thus, the global bit line GBL2 is not affected by the transition of the potential of the global bit line GBL1 due to that the global bit line GBL1 is independently operated. Thereby, it is possible to improve sensing margin (sensing margin for each of the two sense amplifiers SA1 and SA2). The switching point from the first period to the second period, which corresponds to the above predetermined time, is preferably set to a timing at which a transition ratio of the potential of the global bit line GBL1 is less than about 20 percent. From a different viewpoint, the potential of the global bit line GBL1 may reach about 80 percent of a predetermined potential at this timing due to the sensing by the sense amplifier SA1. Further, in this case, it is preferable to provide an element that supplies a fixed potential to at least one of the two global bit lines GBL1 and GBL2, the one of which is not amplified earlier than the other (global bit line GBL2). During a period when at least the sense amplifier SA1 associated with the global bit line GBL1 is sensing, the above element supplying the fixed potential (precharge element) is activated so that shielding effect (shielding effect of the global bit line GBL2 for the global bit line GBL1) can be obtained, thereby further suppressing the coupling noise.

Preferred embodiments of the invention will be described in detail below with reference to accompanying drawings. In the following embodiments, the present invention is applied to a DRAM (Dynamic Random Access Memory) as an example of the semiconductor device.

First Embodiment

Figure 2:
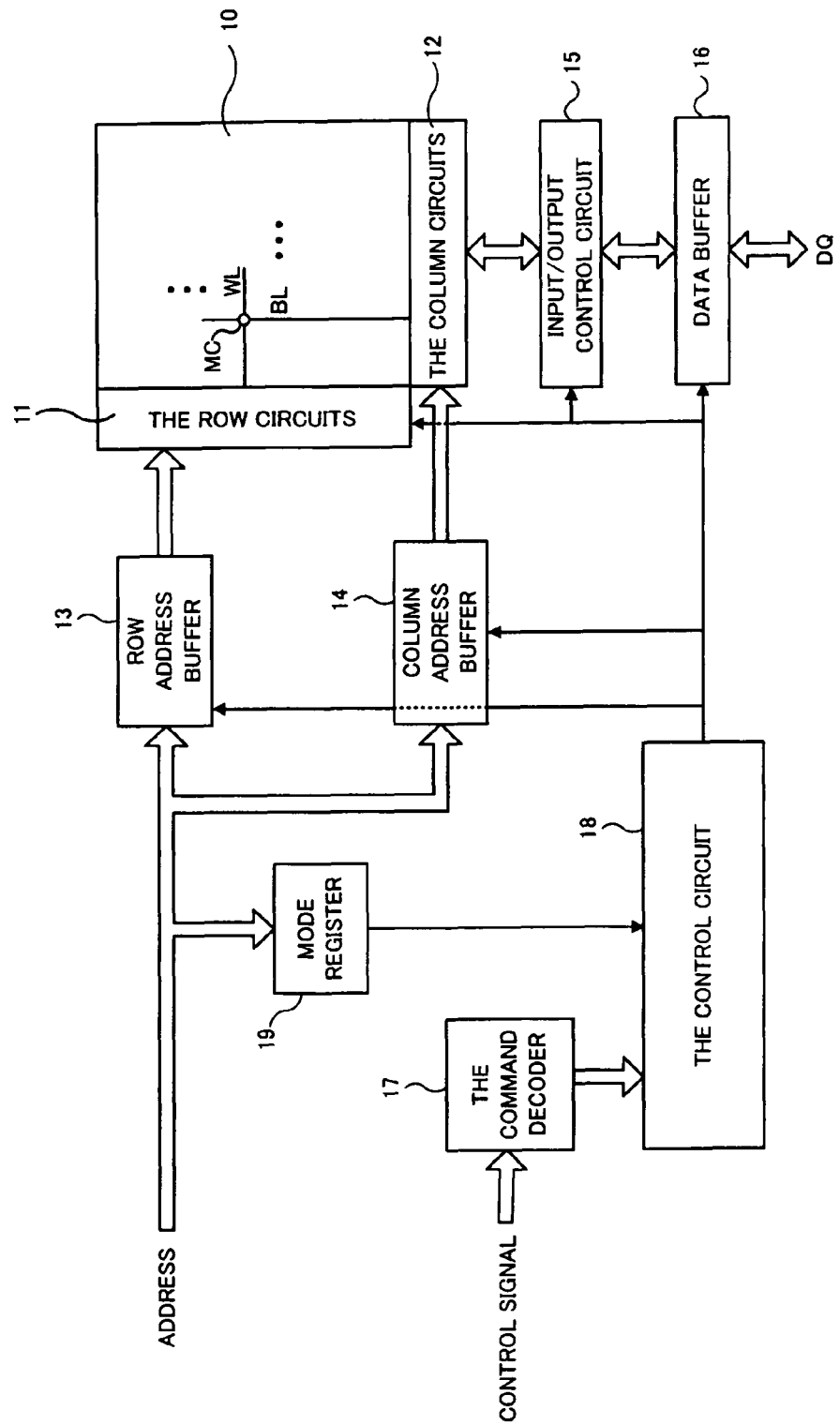
FIG. 2 is a block diagram showing an entire configuration of a DRAM of a first embodiment.

FIG. 2 is a block diagram showing an entire configuration of the DRAM of a first embodiment. The DRAM shown in FIG. 2 includes a memory cell array 10 having a plurality of memory cells MC arranged at intersections of a plurality of word lines WL and a plurality of bit lines BL (later-described local bit lines), and row circuits 11 and column circuits 12 that are attached to the memory cell array 10. The row circuits 11 includes a large number of circuits provided corresponding to the plurality of word lines WL, and the column circuits 12 includes a large number of circuits provided corresponding to the plurality of bit lines BL. In addition, since a hierarchical bit line structure is employed in the first embodiment, each bit line BL of the memory cell array 10 is hierarchized into a global bit line GBL of an upper hierarchy and local bit lines LBL of a lower hierarchy, which will be described in detail later.

Externally input addresses includes a row address and a column address, the row address is stored in a row address buffer 13 and sent to the row circuits 11, and the column address is stored in a column address buffer 14 and sent to the column circuits 12. Data transfer between the column circuits 12 and a data buffer 16 is controlled by an input/output control circuit 15, and the data is transferred from/to outside via input/output data terminals (DQ).

A command decoder 17 determines a command for the DRAM based on externally input control signals and sends the command to a control circuit 18. The control circuit 18 controls operations of respective parts of the DRAM according to a command type determined by the command decoder 17. The control circuit 18 controls the operations in conjunction with an internal clock generated by a clock generation circuit (not shown). Further, the control circuit 18 controls a plurality of circuits in the memory cell array 10 (such as word lines WL, sense amplifiers SA, hierarchy switches for electrically connecting the local bit lines LBL to the global bit lines GBL, elements for precharging the global bit lines GBL and the local bit lines LBL, and the like). Furthermore, a mode register 19 selectively sets operation modes of the DRAM based on the above addresses and sends setting information to the control circuit 18.

Figure 3:
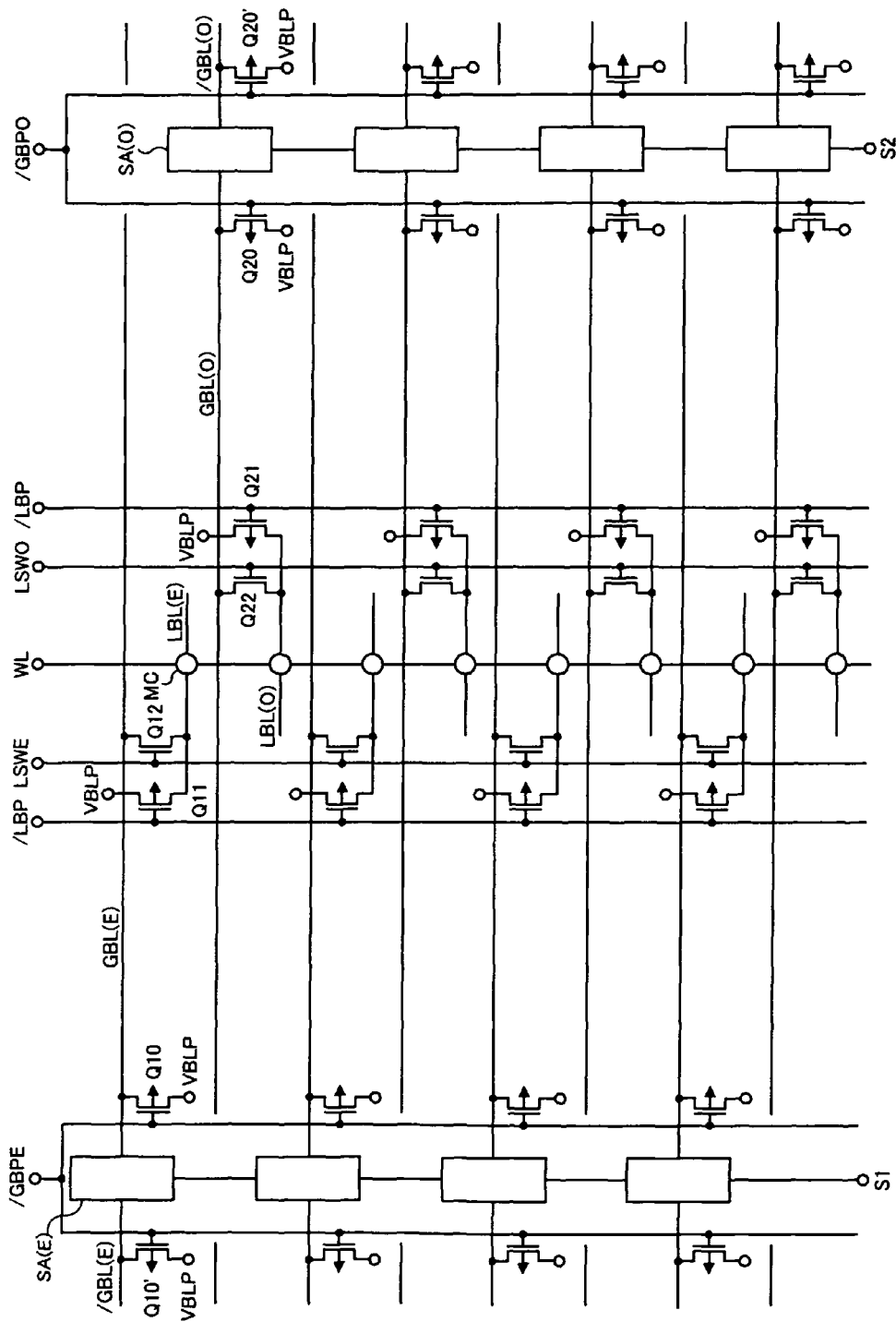
FIG. 3 is a diagram showing a configuration of a memory cell array and its peripheral portion in the DRAM of the first embodiment.

Next, FIG. 3 shows a configuration of the memory cell array 10 and its peripheral portion in the DRAM of FIG. 2. As shown in FIG. 3, the memory cell array 10 of the first embodiment employs an open bit line structure and further employs a hierarchical bit line structure using the local bit lines LBL and the global bit lines GBL. In the memory cell array 10 of FIG. 3, for example, assuming that M global bit line GBL are arranged with a predetermined pitch, M/2 sense amplifiers SA are aligned on each of left and right sides of the memory cell array 10 alternately in a zigzag manner. In other words, assuming that the M global bit line GBL are arranged in the order of numbers 0 to M-1 from the top to the bottom of FIG. 3, even-numbered global bit lines GBL(E) are connected to sense amplifier SA(E) on the left, and odd-numbered global bit lines GBL(O) are connected to sense amplifiers SA(O) on the right. Each sense amplifier SA(E) on the left is activated by a sense amplifier activation signal S1, and each sense amplifier SA(O) on the right is activated by a sense amplifier activation signal S2.

Further, a complementary global bit line /GBL that is arranged on the other side of the global bit line GBL via the sense amplifier SA is connected to each sense amplifier SA, in addition to the global bit lines GBL. That is, a complementary global bit line /GBL(E) is connected to the sense amplifier SA(E) on the left, and a complementary global bit line /GBL(O) is connected to the sense amplifier SA(O) on the right. Each of the complementary global bit lines /GBL supplies a potential as a reference of the sensing of the global bit line GBL that is sensed by the corresponding sense amplifier SA.

A PMOS type transistor Q10 for precharging (the first potential supplying circuit of the invention) is connected to an even-numbered global bit line GBL(E). The transistor Q10 supplies a precharge voltage VBLP to the global bit line GBL(E) when a precharge signal /GBPE applied to its gate is changed to a low level. A PMOS type transistor Q20 for precharging (the second potential supplying circuit of the invention) is connected to an odd-numbered global bit line GBL(O). The transistor Q20 supplies the precharge voltage VBLP to the global bit line GBL(O) when a precharge signal /GBPO applied to its gate is changed to a low level. In addition, transistors Q10' and Q20' for precharging corresponding to the above transistors Q10 and Q20 are connected to the complementary global bit lines /GBL.

N local bit lines LBL segmented in an extending direction of each global bit line GBL are aligned corresponding to the hierarchical bit line structure. That is, N local bit lines LBL(E) are aligned along the even-numbered global bit line GBL(E) in the same direction thereof, and N local bit lines LBL(O) are aligned along the odd-numbered global bit line GBL(O) in the same direction thereof. FIG. 3 shows only one of the segmented N local bit lines LBL in relation to each global bit line GBL. A plurality of memory cells MC are connected to each local bit line LBL, and a signal voltage of a memory cell MC arranged at an intersection of a selected one word line WL and the local bit line LBL is read out to the local bit line LBL. In addition, FIG. 3 shows only one of a plurality of word lines WL.

Since the plurality of memory cells MC are connected to each local bit line LBL, parasitic capacitance thereof per unit length is several times larger than parasitic capacitance of the global bit line GBL. Accordingly, by employing the hierarchical bit line structure, the length of the local bit line LBL becomes one N-th of the length of the global bit line GBL, and therefore the total bit line capacitance can be drastically reduced. In practice, by setting N within a range between N=8 to 16, for example, a sufficient signal voltage can be read out from a memory cell MC whose memory cell capacitance Cs is low. In this manner, employing the hierarchical bit line structure is effective to shorten the length of each local bit line LBL so as to reduce its parasitic capacitance.

A PMOS type transistor Q11 and an NMOS type transistor Q12 (the first switch of the invention) are connected to the even-numbered local bit line LBL(E). The transistor Q11 for precharging supplies the precharge voltage VBLP to the local bit line LBL(E) when a precharge signal /LBP applied to its gate is changed to a low level. The transistor Q12 controls a connection between the local bit line LBL(E) and the global bit line GBL(E) in response to a connection control signal LSWE applied to its gate. Further, a PMOS type transistor Q21 and an NMOS type transistor Q22 (the second switch of the invention) are connected to the odd-numbered local bit line LBL(O). The transistor Q21 for precharging supplies the precharge voltage VBLP to the local bit line LBL(O) when the precharge signal /LBP applied to its gate is changed to a low level. The transistor Q22 controls a connection between the local bit line LBL(O) and the global bit line GBL(O) in response to a connection control signal LSWO applied to its gate.

Figure 4:
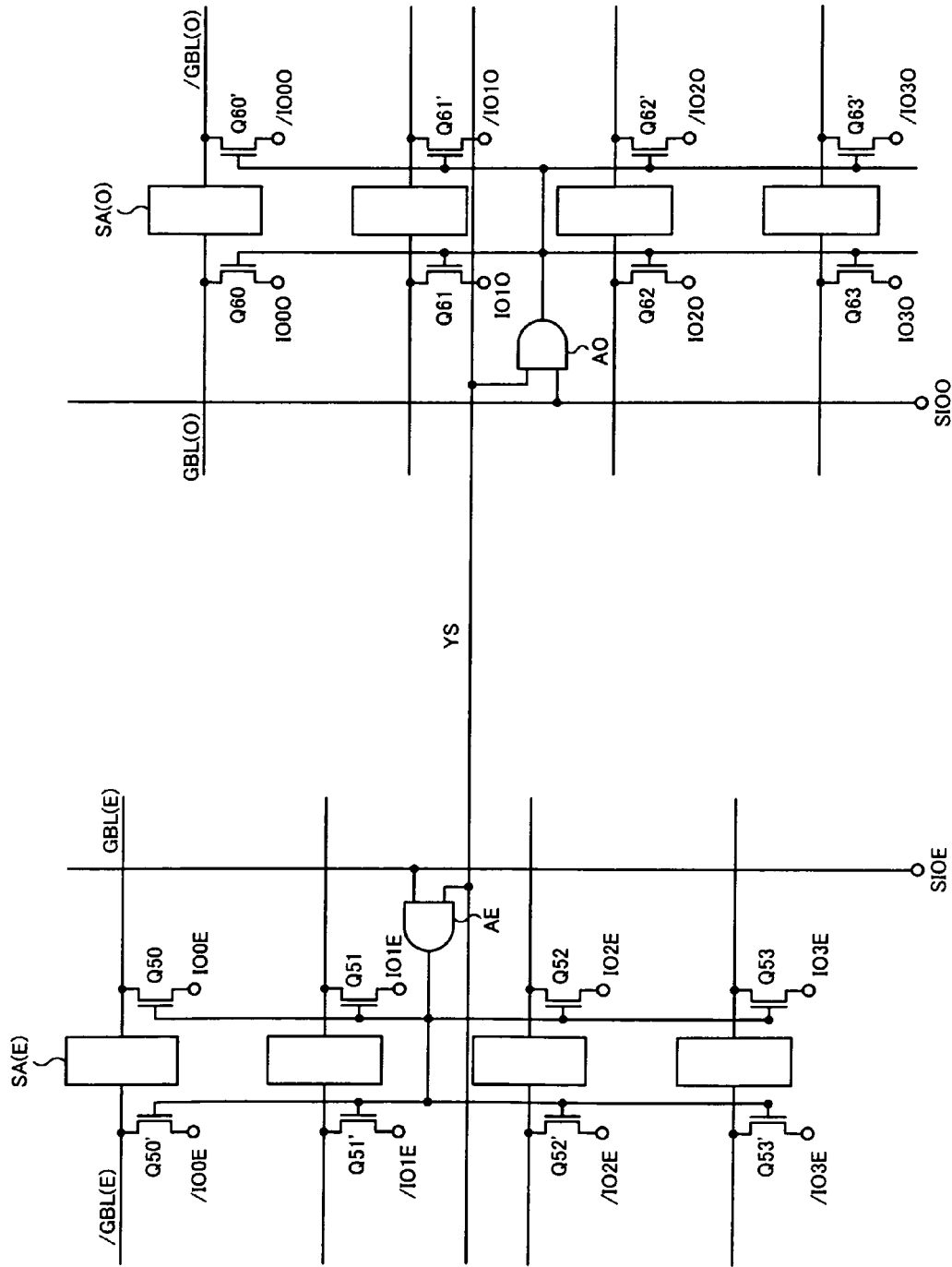
FIG. 4 is a diagram showing a configuration example of a column select circuit included in column circuits of FIG. 2.

FIG. 4 shows a configuration example of a column select circuit 20 included in the column circuits 12 (FIG. 2) in association with the configuration of FIG. 3. As shown in FIG. 4, the column select circuit 20 includes a column decoder (not shown) that drives column select lines YS, NMOS type transistors Q50 to Q53, Q50' to Q53', Q60 to Q63, and Q60' to Q63' that function as column switches, and AND gates AE and AO. The example of FIG. 4 shows a case where one column select line YS is arranged for eight sense amplifiers SA.

One AND gate AE takes a logical product of one IO select signal SIOE and the column select line YS and supplied it to respective gates of eight transistors Q50 to Q53, Q50' to Q53'. In an area near the sense amplifier SA(E) on the left, the transistors Q50 to Q53 selectively connect each global bit line GBL(E) to four input/output lines IO0E to IO3E, and the transistors Q50' to Q53' selectively connect each complementary global bit line /GBL(E) to four complementary input/output lines /IO0E to /IO3E, respectively, in response to an output of the AND gate AE.

The other AND gate AO takes a logical product of the other IO select signal SIOO and the column select line YS and supplied it to respective gates of eight transistors Q60 to Q63, Q60' to Q63'. In an area near the sense amplifier SA(O) on the right, the transistors Q60 to Q63 selectively connect each complementary global bit line /GBL(O0) to four input/output lines IO0O to IO3O, and the transistors Q60' to Q63' selectively connect each complementary global bit line /GBL(O) to four complementary input/output lines /IO0O to /IO3O, respectively, in response to an output of the AND gate AO.

In the configuration of FIG. 4, for example, when data is read out to the input/output line from the sense amplifier SA(E) that has performed a first sensing operation, or when the sense amplifier SA(O) is performing a second sensing operation in data writing from the input/output line to the sense amplifier SA(E), one IO select signal SIOE is changed to a high level and the other IO select signal SIOO is changed to a low level. Thereby, reading or writing of data for one sense amplifier SA(E) can be performed without affecting the operation of the other the sense amplifier SA(O). Further, after the second sensing operation (the sensing operation of the other sense amplifier SA(O)) completes, by appropriately selecting two IO select signals SIOE and SIOO, either or both of the sense amplifier SA(E) and SA(O) can be simultaneously selected so as to read or write the data.

Figure 5:
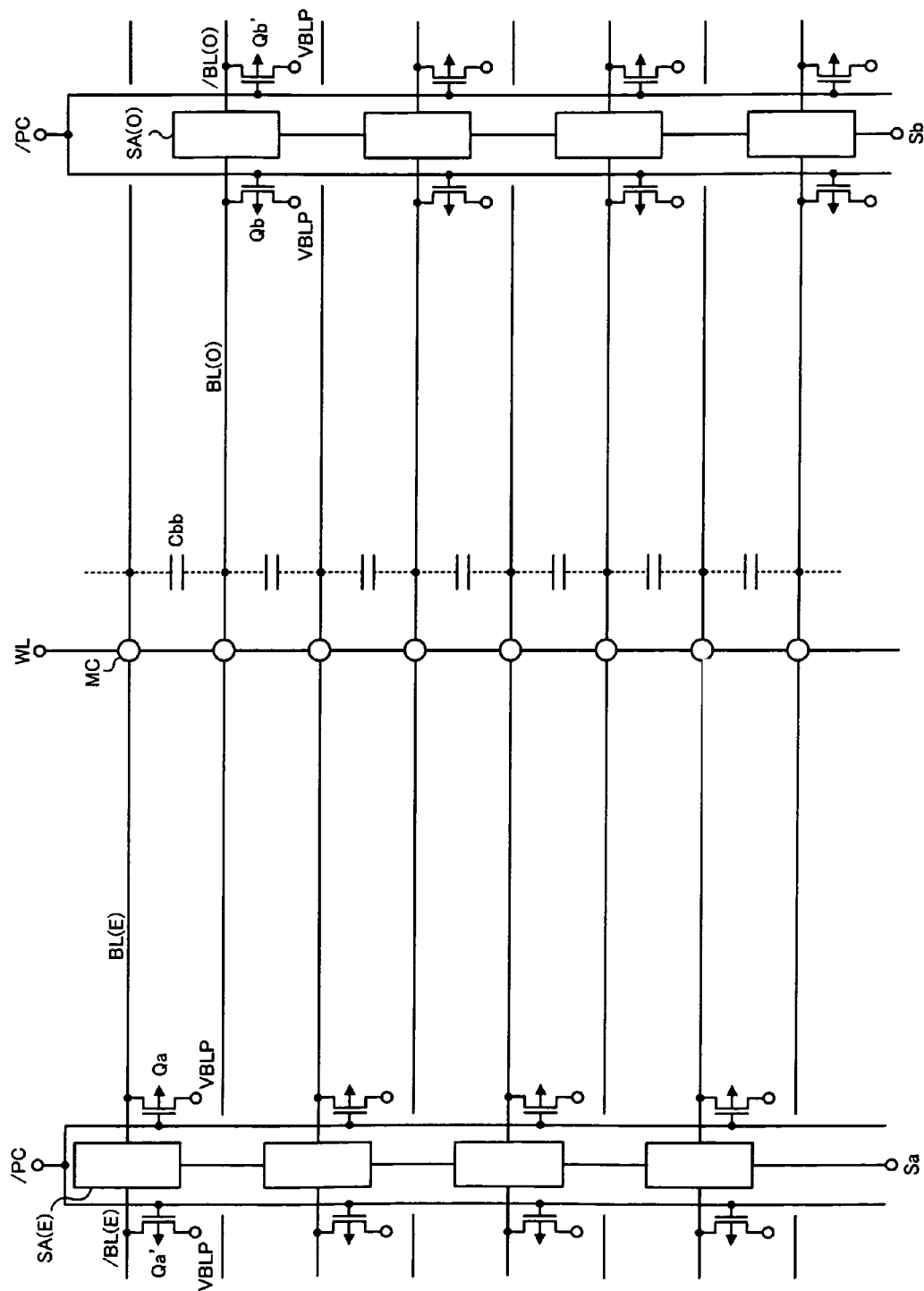
FIG. 5 is a diagram showing a configuration of a conventional memory cell array employing an open bit line structure and its periphery for the purpose of comparing with FIG. 3.

Hereinafter, a structural feature of the first embodiment will be described by comparing FIG. 5 with FIG. 3. FIG. 5 is a comparison example showing a configuration of a conventional memory cell array 10 employing the open bit line structure and its periphery. In the comparison example of FIG. 5, the bit line structure is non-hierarchical, and, for example, N sense amplifiers SA corresponding to N bit lines BL are aligned in a zigzag manner. In FIG. 5, the word line WL, the complementary bit lines /BL(E) and the transistors Qa and Qa' corresponding to the even-numbered bit lines BL(E), the complementary bit lines /BL(O) and the transistors Qb and Qb' corresponding to the odd-numbered bit lines BL(O), and the precharge signal /PC applied to gates of the transistors Qa, Qa', Qb and Qb', respectively correspond to the configuration of FIG. 3. However, in FIG. 5, the local bit lines LBL and the transistors Q11, Q12, Q21 and Q22 in FIG. 3 are not provided. Therefore, when the signal voltage that is read out from a memory cell MC corresponding to a selected word line WL is sensed and amplified by the sense amplifier SA, there arises a problem of coupling noise due to influence of a coupling capacitance Cbb between adjacent bit lines BL. Particularly when the bit line pitch is reduced with miniaturization of manufacturing, a ratio of the coupling capacitance Cbb to overall bit line capacitance increases, and therefore the coupling noise increases so that sensing margin of the sense amplifier SA decreases. In the configuration of the first embodiment (FIG. 3), the transistors Q12 and Q22 functioning as switches between the global bit lines GBL and the local bit lines LBL are provided and a later-described control is performed, thereby achieving a decrease in the coupling noise.

Figure 6:
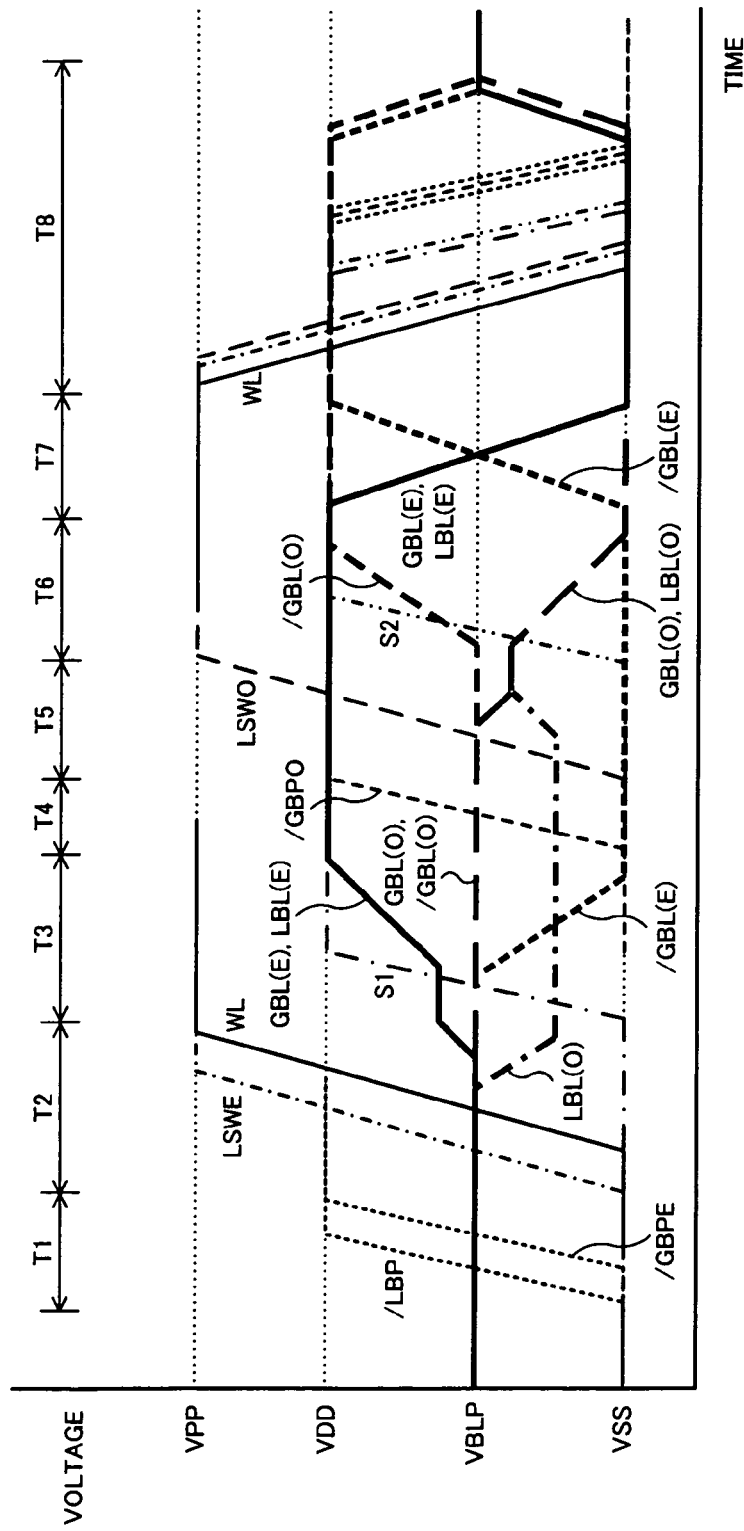
FIG. 6 is a diagram showing operation waveforms of the memory cell array of FIG. 3 in an operation.

Next, an operation of the memory cell array 10 of the first embodiment will be described. FIG. 6 shows operation waveforms of respective parts in the memory cell array 10 of FIG. 3. First, during an initial period (before a precharge cancellation period T1), all of the global bit lines GBL and /GBL and the local bit line LBL are in a state of being precharged to the precharge voltage VBLP. Further, all of the sense amplifier activation signals S1 and S2, the precharge signals /GBPE, /GBPO and /LBP, the connection control signals LSWE and LSWO and the word line WL are set to a low level (ground potential VSS).

The precharge cancellation period T1 is a period in which the precharge operation for setting a plurality of nodes to a predetermined potential is cancelled. During the precharge cancellation period T1, the precharge signals /LBP and /GBPE are changed from the low level to the high level (supply voltage VDD), and the local bit line LBL and the global bit line GBL(E) that are in the state of being precharged to the precharge voltage VBLP become floating. At this point, since the precharge signal /GBPO is maintained at the low level, the global bit line GBL(O) continues to be in the state of being precharged to the precharge voltage VBLP.

Next, during a selection period T2, the connection control signal LSWE is changed from the low level to a voltage VPP as the high level, and the local bit line LBL(E) and the global bit line GBL(E) are electrically connected to each other through the transistor Q12 (FIG. 3). On the other hand, since the connection control signal LSWO is maintained at the low level, the local bit line LBL(O) and the global bit line GBL(O) continue to be in an electrically disconnected state. Subsequently, the word line WL is driven to the voltage VPP as a selected state, and thus a plurality of signal voltages are read out from a plurality of memory cells MC to the corresponding plurality of local bit lines LBL, respectively. At this point, since the connection control signal LSWE is at the high level, a corresponding signal voltage is transmitted from the local bit line LBL(E) to the global bit line GBL(E). On the other hand, since the connection control signal LSWO is at the low level, the corresponding signal voltage is maintained at the local bit line LBL(O). The global bit line GBL(O) continues to be precharged to the precharge voltage VBLP. The example of FIG. 6 shows a case where signal voltages of the even-numbered local bit line LBL(E) and the global bit line GBL(E) are at the high level (data "1") and the signal voltage of the odd-numbered local bit line LBL(O) is at the low level (data "0"). As shown in FIG. 6, the potential variation of the local bit line LBL(O) is larger than the potential variation of the local bit line LBL(E). This is because the parasitic capacitance of the local bit line LBL(O) that is in a state of being electrically disconnected from the global bit line GBL(O) by the connection control signal LSWO is smaller than the parasitic capacitance of the local bit line LBL(E) that is in a state of being electrically connected to the global bit line GBL(E) by the connection control signal LSWE.

During an amplification period T3 (included in the first period of the invention), the sense amplifier activation signal S1 is changed from the low level to the high level so that the sense amplifier SA(E) is activated. When the sense amplifier SA(E) is activated, respective potentials of the global bit line GBL(E) and the local bit line LBL (E) are amplified to the supply voltage VDD, and the potential of the complementary global bit line /GBL(E) is amplified to the ground potential VSS. In addition, the complementary global bit line /GBL(E) and the complementary local bit line /LBL(E) on the left side of the sense amplifier SA(E) are hierarchized corresponding to the hierarchy of the global bit line GBL(E) and the local bit line LBL(E) on the right side of the sense amplifier SA(E). Therefore, the parasitic capacitances of hierarchical bit lines on both sides of the sense amplifier SA(E) are desired to be equal by electrically connecting the complementary global bit line /GBL(E) to the complementary local bit line /LBL(E), in the same manner for the global bit line GBL (E) and the local bit line LBL(E). The word line WL associated with the memory cell MC connected to the complementary local bit line /LBL(E) is in a non-active state (not shown).

During the above amplification period T3, the global bit line GBL(O) is in a state of being precharged to the precharge voltage VBLP, and thus this functions as a shielding line for the transition of the potential of the global bit line GBL(E) in the first sensing operation. That is, the global bit line GBL(E) can have a shielding effect of drastically reducing the coupling noise from the adjacent global bit line GBL(O). Further, the global bit line GBL(O) functioning as the shielding line has a shielding effect of drastically reducing mutual noise between a plurality of global bit lines GBL(E) arranged on both sides of the global bit line GBL(O). Meanwhile, since the local bit line LBL(O) is in a state where the signal voltage of the low level (data "0") has been read out, as described above, the local bit line LBL(O) receives the coupling noise (data "1") from the adjacent local bit line LBL(E). However, the length of the local bit line LBL is short and its parasitic capacitance is large due to the influence of the memory cell capacitance Cs, and therefore the influence of the above coupling noise is suppressed.

Next, during a second precharge cancellation period T4, the precharge signal /GBPO is changed from the low level to the high level, and the global bit line GBL(O) that is in the state of being precharged to the precharge voltage VBLP becomes floating. Subsequently, when a selection period T5 starts, the connection control signal LSWO is changed from the low level to the voltage VPP as the high level, and thereby the local bit line LBL(O) and the global bit line GBL(O) are electrically connected through the transistor Q22 (FIG. 3). As a result, the signal voltage of the low level (data "0") of the local bit line LBL(O) is transmitted to the global bit line GBL(O) due to charge sharing between the local bit line LBL(O) and the global bit line GBL(O).

During a second amplification period T6 (included in the second period of the invention), the sense amplifier activation signal S2 is changed from the low level to the high level so that the sense amplifier SA(O) is activated. When the sense amplifier SA(O) is activated, respective potentials of the global bit line GBL(O) and the local bit line LBL(O) are amplified to the ground potential VSS, and the potential of the complementary global bit line /GBL(O) is amplified to the supply voltage VDD. In this case, in order to equalize the parasitic capacitances of the hierarchical bit lines on both sides of the sense amplifier SA(O), as described above, it is desirable to electrically connect between the complementary global bit line /GBL(O) and the complementary local bit line /LBL(O).

During the above amplification period T6, the first sensing operation for the global bit line GBL(E) and the local bit line LBL(E) has completed and they are being maintained at the supply voltage VDD, which functions as a shielding line for the transition of the potential of the global bit line GBL(O) in the second sensing operation. That is, the global bit line GBL(O) and the local bit line LBL(O) can have a shielding effect of drastically reducing the coupling noise from the respective adjacent global bit lines GBL(E) and the local bit lines LBL(E). Further, the global bit lines GBL(E) and the local bit lines LBL(E) each functioning as the shielding line have a shielding effect of drastically reducing respective mutual noises between the plurality of global bit lines GBL(O) and the local bit lines LBL(O) arranged on both sides of the global bit lines GBL(E) and the local bit lines LBL(E).

In addition, a write period T7 after the end of the amplification period T6 is set to perform a write operation for a plurality of memory cells MC respectively connected to a plurality of local bit lines LBL from outside the semiconductor device in the first embodiment. The example of FIG. 6 shows the operation waveforms in a case where data of the low level (data "0") is written into a memory cell MC associated with the local bit line LBL(E) among the plurality of memory cells MC that correspond to the selected word line WL through the local bit line LBL(E). That is, as described in the above explanation, the memory cell MC associated with the local bit line LBL(E) holds the data "1", and the data "0" is written into this memory cell MC. During the write period T7, the global bit line GBL(E) and the local bit line LBL(E) are driven to the ground potential VSS by a write amplifier (not shown), and the complementary global bit line /GBL(E) is driven to the supply voltage VDD. This shows that the operation in the write period T7 is performed after the amplification period T6 (the second period of the invention). Thereby, the sensing of the global bit line GBL(O) and the local bit line LBL(O) is finished during the amplification period T6 before the above write operation, and therefore the transition of the potential of the global bit line GBL(E) does not give the coupling noise to the global bit line GBL(O) that is being sensed. The write operation of a memory cell MC associated with the global bit line GBL(O) and the local bit line LBL(O) is performed in the same manner. The sensing of the global bit line GBL(E) and the local bit line LBL(E) is finished during the above amplification period T3 before the above write operation, and therefore the transition of the potential of the global bit line GBL(O) and the local bit line LBL(O) does not give the coupling noise to the global bit line GBL(E) and the local bit line LBL(E) that is being sensed. The above disclosed descriptions show that it is important that at least potentials of physically adjacent lines do not transition during a period in which the sense amplifier SA senses a minute potential.

When a precharge period T8 starts, the word line WL returns from the high level to the low level as a non-selected state, and the memory cell MC is electrically disconnected from the local bit line LBL. Further, the connection control signals LSWE and LSWO are changed from the high level to the low level, and the local bit line LBL is electrically disconnected from the global bit line GBL. Subsequently, the sense amplifier activation signals S1 and S2 are changed from the high level to the low level, and the activation of the sense amplifier SA is finished. Subsequently, the precharge signals /GBPE, /GBPO and /LBP are changed from the high level to the low level, and the global bit line GBL, the complementary global bit line /GBL and the local bit line LBL are precharged to the precharge voltage VBLP. At this point, a series of cycles shown in FIG. 6 is finished.

Modification of First Embodiment

A modification of the first embodiment will be described, in which the connection control signals LSWE and LSWO can be controlled in the following manner. That is, in an initial period (before the precharge cancellation period T1), the connection control signals LSWE and LSWO are both set into a conductive state (high level). During the selection period T2, the connection control signal LSWO is set into a non-conductive state (low level) and the connection control signal LSWE is maintained in the conductive state (high level). During the selection period T5, the connection control signal LSWE is set into the non-conductive state (low level) and the connection control signal LSWO is set into the conductive state (high level) from the non-conductive state (low level).

Second Embodiment

Figure 7:
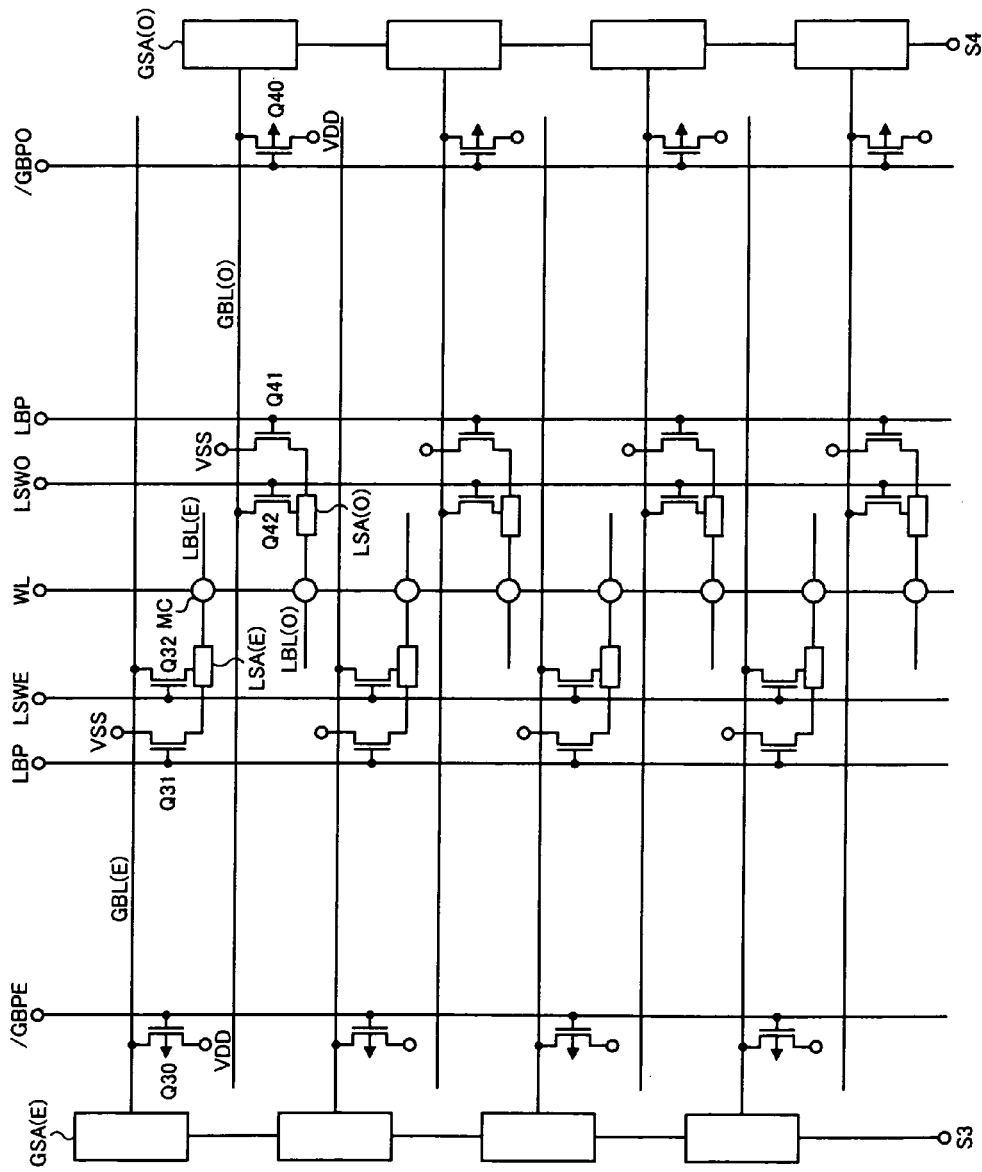
FIG. 7 is a diagram showing a configuration of the memory cell array and its peripheral portion in the DRAM of a second embodiment.

Next, the DRAM of a second embodiment to which the invention is applied will be described. The entire configuration of the DRAM of FIG. 2 is common in the second embodiment, so description thereof will be omitted. FIG. 7 shows a configuration of the memory cell array 10 and its peripheral portion in the DRAM of the second embodiment, which shows an area corresponding to FIG. 3. As shown in FIG. 7, the memory cell array 10 of the second embodiment employs the hierarchical bit line structure, which is not the open bit line structure as in the first embodiment, and employs a single-ended array configuration using single-ended amplifies. For example, a single-ended local sense amplifier LSA has a configuration in which a gate terminal (input node of the amplifier) of the first transistor constituting the amplifier is connected to the local bit line LBL to which the memory cell MC is connected, and a drain terminal (output node of the amplifier) is connected to the global bit line GBL as a higher hierarchy. The second transistor activating the local sense amplifier LSA is connected in series with the first transistor. The first precharge transistor is attached to the local bit line LBL. A single-ended global sense amplifier GSA has a configuration in which a gate terminal (input node of the amplifier) of the first transistor constituting the amplifier is connected to the global bit line GBL, and a drain terminal (output node of the amplifier) is connected to a data bus line as a higher hierarchy. The second transistor activating the global sense amplifier GSA is connected in series with the first transistor. The second precharge transistor is attached to the global bit line GBL. That is, the single-ended amplifier does not require a complementary bit line used as a reference in the sensing operation. In FIG. 7, the arrangement of the global bit lines GBL and the local bit lines LBL are the same as in FIG. 3.

Meanwhile, the even-numbered global bit line GBL(E) is connected to a global sense amplifier GSA(E) on the left, and the odd-numbered global bit line GBL(O) is connected to a global sense amplifier GSA(O) on the right. The global sense amplifier GSA(E) on the left is activated by a sense amplifier activation signal S3, and the global sense amplifier GSA(O) on the right is activated by a sense amplifier activation signal S4. In addition, each of the global sense amplifiers GSA is a single-ended sense amplifier, and therefore only one global bit line GBL is connected thereto, as different from FIG. 3.

A PMOS type transistor Q30 for precharging (the first potential supplying circuit of the invention) is connected to the even-numbered global bit line GBL(E). The transistor Q30 supplies the supply voltage VDD to the global bit line GBL(E) when the precharge signal /GBPE applied to its gate is changed to a low level. A PMOS type transistor Q40 for precharging (the second potential supplying circuit of the invention) is connected to the odd-numbered global bit line GBL(O). The transistor Q40 supplies the supply voltage VDD to the global bit line GBL(O) when the precharge signal /GBPO applied to its gate is changed to a low level.

The single-ended local sense amplifiers LSA is provided at one end of each local bit line LBL, and the signal of the local bit line LBL is sensed and amplified by the local sense amplifiers LSA in response to an activation signal (not shown). As shown in FIG. 7, a local sense amplifier LSA(E) connected to the even-numbered local bit line LBL(E) and a local sense amplifier LSA(O) connected to the odd-numbered local bit line LBL(O) are alternately aligned. NMOS type transistors Q31 and Q32 are connected to the local sense amplifier LSA (E). The transistor Q31 for precharging supplies the ground potential VSS to the local bit line LBL(E) when a precharge signal LBP applied to its gate is changed to a high level. The transistor Q32 controls a connection between an output node of the local sense amplifier LSA(E) and the global bit line GBL(E) in response to the connection control signal LSWE applied to its gate. Further, NMOS type transistors Q41 and Q42 are connected to the local sense amplifier LSA(O). The transistor Q41 for precharging supplies the ground potential VSS to the local bit line LBL(O) when the precharge signal LBP applied to its gate is changed to a high level. The transistor Q42 controls a connection between an output node of the local sense amplifier LSA(O) and the global bit line GBL (O) in response to the connection control signal LSWO applied to its gate. In addition, each of the transistors Q32 and Q42 can be used as the second transistor activating the corresponding local sense amplifier LSA.

Although the second embodiment shows a case where the precharge voltage of the global bit line GBL is the supply voltage VDD and the precharge voltage of the local bit line LBL is the ground potential VSS, the respective precharge voltage may be appropriately changed corresponding to the circuit configurations of the global sense amplifier GSA and the local sense amplifier LSA.

In the second embodiment, the arrangement corresponding to the hierarchical bit line structure is the same as in the first embodiment, and additionally it is characteristic that the sense amplifier structure is also hierarchized. Thus, the signal voltage is amplified by the local sense amplifier LSA while the parasitic capacitance of the local bit line LBL is reduced, and thereby the global bit line GBL can be driven with high-speed.

Figure 8:
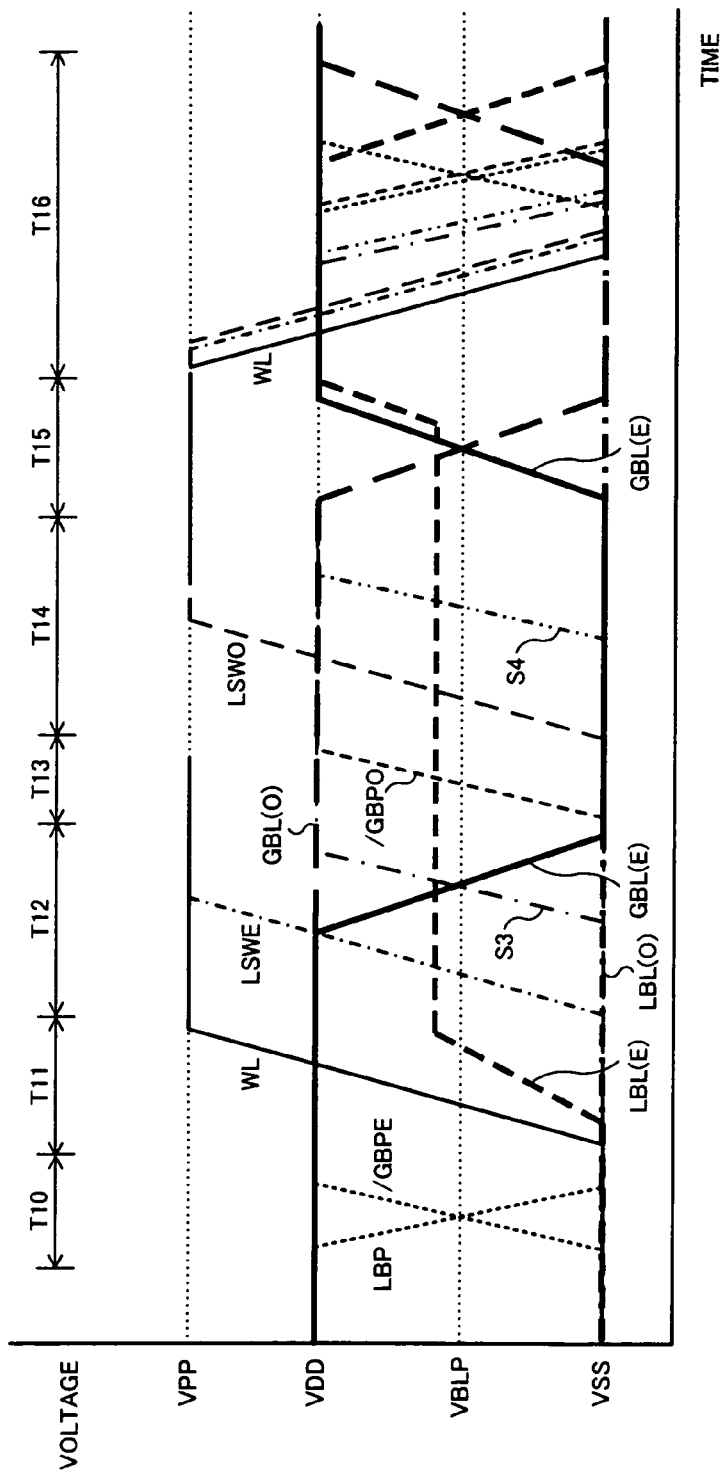
FIG. 8 is a diagram showing operation waveforms of the memory cell array of FIG. 7 in an operation.

Next, an operation of the memory cell array 10 of the second embodiment will be described. FIG. 8 shows operation waveforms of respective parts in the memory cell array 10 of FIG. 7. First, during an initial period (before a precharge cancellation period T10), all the global bit lines GBL are in a state of being precharged to the supply voltage VDD, and all the local bit lines LBL are in a state of being precharged to the ground potential VSS. Further, the sense amplifier activation signals S3, S4, the precharge signals /GBPE, /GBPO, the connection control signals LSWE, LSWO and the word line WL are respectively maintained at a low level (ground potential VSS), and the precharge signal LBP is maintained at a high level (the supply voltage VDD).

During the precharge cancellation period T10, the precharge signal /GBPE is changed from the low level to the high level and the precharge signal LBP is changed from the high level to the low level, the global bit line GBL(E) that is in the state of being precharged to the supply voltage VDD becomes floating, and the local bit line LBL that is in the state of being precharged to the ground potential VSS becomes floating. At this point, since the precharge signal /GBPO continues to be maintained at the low level, the global bit line GBL(O) continues to be in the state of being precharged to the supply voltage VDD.

Next, during a selection period T11, when the word line WL is driven to the voltage VPP as a selected state, signal voltages of a corresponding plurality of memory cells MC are read out respectively. The example of FIG. 8 shows a case where the signal voltage of a high level (data "1") is read out to the even-numbered local bit line LBL(E), and the signal voltage of a low level (data "0") is read out to the odd-numbered local bit line LBL(O). As shown in FIG. 8, since the parasitic capacitance of the local bit line LBL(E) is small, a potential variation thereof becomes large. Meanwhile, the local bit line LBL(O) continues to be maintained at the ground potential VSS as the previously precharged voltage.

During an amplification period T12, the connection control signal LSWE is changed from the low level to the voltage VPP as the high level, and an output node of the local sense amplifier LSA(E) is electrically connected to the global bit line GBL(E) through the transistor Q32 (FIG. 7). At this point, the potential of the global bit line GBL(E) that is inverted and driven by the local sense amplifier LSA(E) falls to the ground potential VSS. Subsequently, the sense amplifier activation signal S3 is changed from the low level to the high level so that the global sense amplifier GSA(E) is activated, and the signal voltage of the global bit line GBL(E) is sensed and latched by the global sense amplifier GSA(E). Meanwhile, since the connection control signal LSWO continues to be maintained at the low level, the global bit line GBL(O) and the local sense amplifier LSA(O) continue to be in an electrically disconnected state.

Since the global bit line GBL(O) continues to be precharged to the supply voltage VDD during the amplification period T12, the global bit line GBL(O) functions as a shielding line. Thus, the global bit line GBL(E) can have a shielding effect of drastically reducing the coupling noise from the adjacent global bit line GBL(O) and the coupling noise from the adjacent global bit line GBL(E), similarly as in the first embodiment.

Next, during a second precharge cancellation period T13, the precharge signal /GBPO is changed from the low level to the high level, and the global bit line GBL(O) that is in the state of being precharged to the supply voltage VDD becomes floating. Subsequently, when an amplification period T14 starts, the connection control signal LSWO is changed from the low level to the voltage VPP as the high level, and the local sense amplifier LSA(O) is electrically connected to the global bit line GBL(O) through the transistor Q42 (FIG. 7). At this point, the potential of the global bit line GBL(O) that is inverted and driven by the local sense amplifier LSA(O) continues to be maintained at the supply voltage VDD. Subsequently, the sense amplifier activation signal S4 is changed from the low level to the high level so that the global sense amplifier GSA(O) is activated, and the signal voltage of the global bit line GBL(O) is sensed and latched by the global sense amplifier GSA(O).

During the above amplification period T14, since the global bit line GBL(E) is in a state of being driven by the global sense amplifier GSA(E), this functions as a shielding line. That is, the global bit line GBL(O) can have a shielding effect of drastically reducing the coupling noise from the adjacent global bit line GBL(E) and the coupling noise from the adjacent global bit line GBL(O).

In addition, a write period T15 is set after the amplification period T14 similarly as in the first embodiment. The example of FIG. 8 shows operation waveforms obtained when restoring data to the memory cells MC to be read (a plurality of memory cells MC associated with the selected word line WL). At this point, the global bit line GBL(E) and the local bit line LBL(E) are driven to the supply voltage VDD, and the data of high level is restored to the corresponding memory cell MC. Further, the global bit line GBL(O) and the local bit line LBL(O) are driven to the ground potential VSS, and the data of low level is restored to the corresponding memory cell MC. In addition, transistors for restoring data (not shown) are arranged between the global bit lines GBL and the local bit lines LBL, which are electrically connected to each other in response to a write control signal (not shown). Thereby, the driving of each global bit line GBL(O) can be performed during the amplification period T14 before the restore operation, and thus it is possible to prevent the coupling noise from being given to the global bit line GBL(O).

When a precharge period T16 starts, the word line WL returns from the high level to the low level as a non-selected state, and the memory cell MC is electrically disconnected from the local bit line LBL. Further, the connection control signals LSWE and LSWO are changed from the high level to the low level, and the local bit line LBL is electrically disconnected from the global bit line GBL. Subsequently, the sense amplifier activation signals S3 and S4 are changed from the high level to the low level, and the activation of the global sense amplifier GSA is finished. Here, the activation of the local sense amplifier LSA is finished at the same time. Subsequently, the precharge signals /GBPE and /GBPO are changed from the high level to the low level so that the global bit line GBL is precharged to the supply voltage VDD, and the precharge signal LBP is changed from the low level to the high level so that the local bit line LBL is precharged to the ground potential VSS. At this point, a series of cycles shown in FIG. 8 is finished.

In addition, the local sense amplifier LSA(E) and the local sense amplifier LSA(O) sense the data of corresponding memory cells MC respectively in response to an activation signal (not shown) after the word line WL is driven to the voltage VPP as the selected state during the selection period T11. Further, the local sense amplifier LSA(E) may sense the data of the corresponding memory cell MC in synchronization with the connection control signal LSWE. The local sense amplifiers LSA(O) may sense the data of the corresponding memory cell MC in synchronization with the connection control signal LSWO.

Here, the column select circuit 20 shown in FIG. 4 can be also applied to the second embodiment. In this case, the complementary configuration of FIG. 4 needs to be changed to the single-ended configuration.

Third Embodiment

Figure 9:
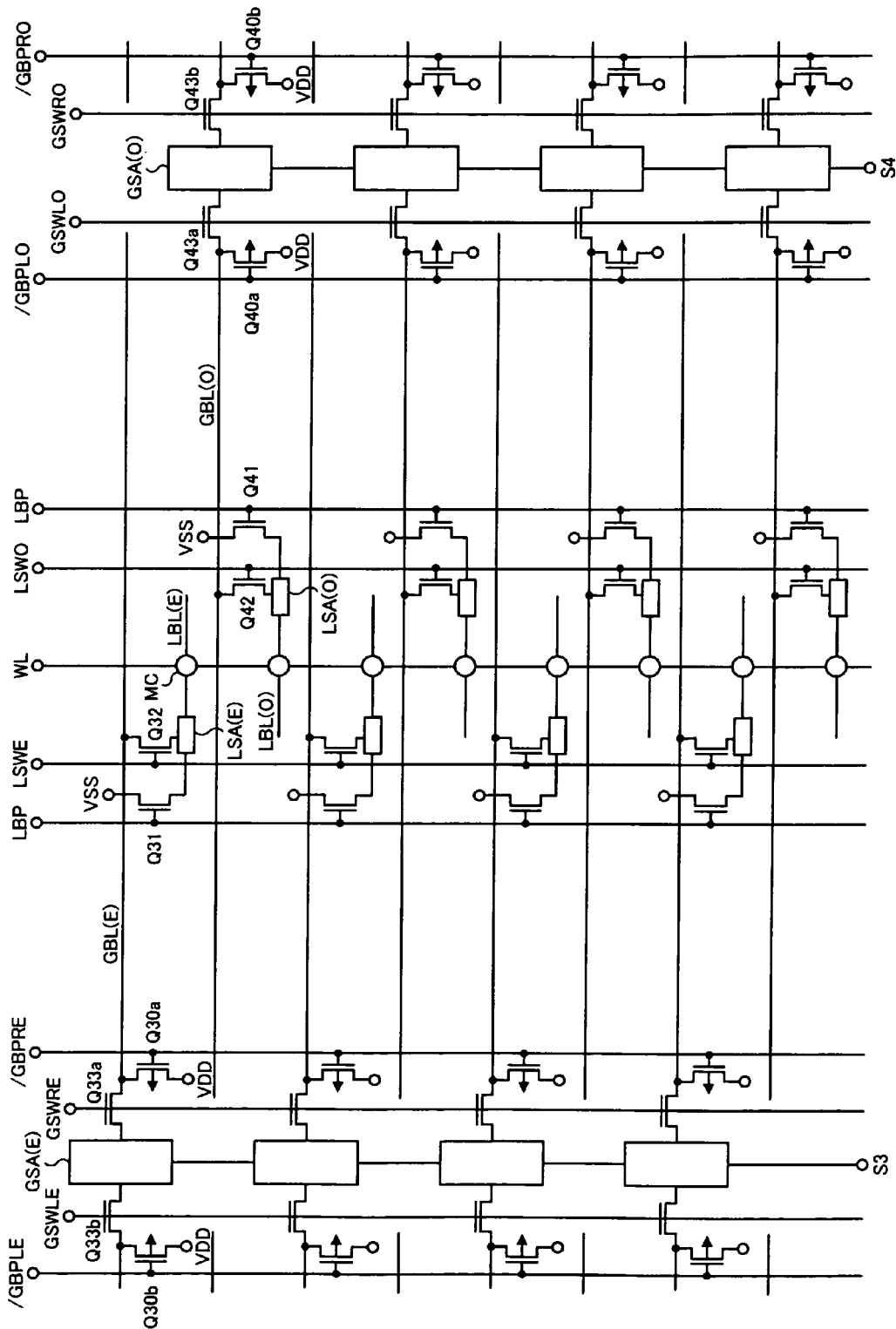
FIG. 9 is a diagram showing a configuration of the memory cell array and its peripheral portion in the DRAM of a third embodiment.

Next, the DRAM of a third embodiment to which the invention is applied will be described. FIG. 9 shows a configuration in the DRAM of the third embodiment, which corresponds to the area of FIG. 7 of the second embodiment. The third embodiment has a configuration based on the configuration of FIG. 7 of the second embodiment, in which each global sense amplifier GSA is shared by two global bit lines GBL belonging to adjacent memory cell arrays 10 on both sides. Therefore, PMOS type transistors Q30a, Q30b, Q40a and Q40b and NMOS type transistors Q33a, Q33b, Q4a and Q43b are arranged instead of the transistors Q30 and Q40 of FIG. 7. In addition, portions of the local sense amplifier LSA and the transistors Q31, Q32, Q41 and Q42 are the same as in FIG. 7.

In FIG. 9, one global sense amplifier GSA(E) is selectively connected to the global bit lines GBL(E) on both sides by the transistor Q33a having a gate applied with a connection control signal GSWRE and the transistor Q33b having a gate applied with a connection control signal GSWLE. Similarly, the other global sense amplifier GSA(O) is selectively connected to the global bit lines GBL(O) on both sides by the transistor Q43a having a gate applied with a connection control signal GSWLO and the transistor Q43b having a gate applied with a connection control signal GSWRO. The transistor Q30a having a gate applied with a precharge signal /GBPRE and the transistor Q30b having a gate applied with a precharge signal /GBPLE have a function to precharge the global bit lines GBL(E) in the same manner as the transistor Q30 of FIG. 7. The transistor Q40a having a gate applied with a precharge signal /GBPLO and the transistor Q40b having a gate applied with a precharge signal /GBPRO have a function to precharge the global bit lines GBL(O) in the same manner as the transistor Q40 of FIG. 7.

In the third embodiment, in order to perform the same operation as in FIG. 8, the connection control signal GSWRE is changed to the voltage VPP, and then the connection control signal GSWLE and the precharge signal /GBPLE are changed to the ground potential VSS, respectively. Thereby, as viewed from the position of the global sense amplifier GSA(E), the global bit line GBL(E) on the right is connected to the global sense amplifier GSA(E), and the global bit line GBL(E) on the left is disconnected from the global sense amplifier GSA(E) so as to continue to be precharged to the supply voltage VDD. At the same time, the connection control signal GSWLO is changed to the voltage VPP, and the connection control signal GSWRO and the precharge signal /GBPRO are changed to the ground potential VSS. Thereby, as viewed from the position of the global sense amplifier GSA(O), the global bit line GBL(O) on the left is connected to the global sense amplifier GSA(O), and the global bit line GBL(O) on the right is disconnected from the global sense amplifier GSA(O) so as to continue to be precharged to the supply voltage VDD. Other operations are the same as those shown in FIG. 8, so description thereof will be omitted.

Fourth Embodiment

Next, the DRAM of a fourth embodiment to which the invention is applied will be described. FIG. 10 shows a schematic configuration of a memory bank in the DRAM of the fourth embodiment, which is configured using the memory cell arrays 10 (FIG. 9) of the third embodiment. The memory bank shown in FIG. 10 includes a large number of memory cell arrays 10 aligned in a bit line direction and a word line direction. In the lower side of FIG. 10, main word line drivers 30 are aligned in a lateral direction, and 17 rows of sub-word line drivers 31 are arranged in parallel with the main word line drivers 30. Further, a column decoder 32 is arranged in a central position in FIG. 10 in a vertical direction. Further, sense amplifier arrays 33 each including global sense amplifiers GSA are arranged on both sides of each memory cell array 10 in the vertical direction. Although the memory bank of FIG. 10 exemplifies a case using the memory cell arrays 10 of the third embodiment, the memory bank may be configured using the memory cell arrays 10 of the first or second embodiment.

In the memory bank shown in FIG. 10, for example, row addresses from 0 to 16383 are set and column addresses from 0 to 8191 are set. In this case, the entire memory bank includes memory cells MC of 128M bits. If a conventional address selection method is applied to such a memory bank, one word line WL is selected in accordance with an externally input row address. Then, data is read out from a plurality of memory cells MC of 8192 bits, which are sensed and latched by the global sense amplifiers GSA(E) and GSA(O) included in the sense amplifier arrays 33 on both sides of the memory cell array 10 to which the selected word line WL belongs.

On the contrary, according to an address selection method of the fourth embodiment, two word lines WL(WL1, WL2) are selected simultaneously when one external address is inputted, as shown in FIG. 10, and the sensing operation being temporally divided into two operations shown in the first to third embodiments is performed. For example, when one word line WL1 is selected which corresponds to a predetermined row address represented as addresses RA13 to RA0 of 14 bits among which the most significant bit RA13 is "0", one word line WL2 is simultaneously selected which corresponds to a row address obtained by inverting only the most significant bit RA13 of the predetermined row address to "1". At this point, it is set that the global sense amplifier GSA(E) and the IO select signal SIOE (FIG. 4) attached thereto correspond to the most significant bit RA13 of "0", and the global sense amplifier GSA(O) and the IO select signal SIOO (FIG. 4) attached thereto correspond to the most significant bit RA13 of "1". Thereby, the first sensing operation is performed by the respective global sense amplifiers GSA in the sense amplifier array 33 on a side corresponding to the value of the most significant bit RA13 among the externally input row address, and only a column switch corresponding thereto is controlled to be activated.

The above control allows a column access to two sense amplifier arrays (including 8192 global sense amplifiers GSA in total by which data read from a plurality of memory cells MC of 8192 bits are sensed and latched) can be performed in the same manner as for the column access in the conventional address selection method. If the second sensing operation is performed, being delayed relative to the sensing operation of the conventional method, it is possible to prevent the column access speed from being delayed. As a result, even if a sensing method capable of suppressing noise between adjacent bit lines is employed by applying the present invention, it is possible to maintain compatibility with the DRAM using the conventional address selection method. In this case, by applying the present invention, the number of selected word lines WL, the number of selected memory cells MC, and the number of activated sense amplifiers are respectively doubled, and despite this, the parasitic capacitance of each bit line is drastically reduced, as described above, thereby suppressing an increase in operating current. Further, since the parasitic capacitance of the bit line can be drastically reduced, the sensing operation can be correspondingly made with higher speed, and it is possible to avoid an increase in overall sensing time even when performing the two sensing operations in chronological order.

In the foregoing, the preferred embodiments of the present invention have been described. However the present invention is not limited to the above embodiments and can variously be modified without departing the essentials of the present invention. For example, the present invention can be applied to a memory device in which the configuration and arrangement of the memory cell array 10 having the hierarchical bit line structure is not limited to the embodiments (FIGS. 3, 7, 9 and the like). Further, various circuit configurations can be employed for the sense amplifier SA, the global sense amplifier GSA, the local sense amplifier LSA, the column select circuit 20, and other circuits.

The present invention is not limited to the DRAM disclosed in the embodiments, and can be applied to various semiconductor devices such as CPU (Central Processing Unit), MCU (Micro Control Unit), DSP (Digital Signal Processor), ASIC (Application Specific Integrated Circuit), ASSP (Application Specific Standard Product) and the like. Further, the present invention can be applied to various devices such as SOC (System on Chip), MCP (Multi Chip Package) and POP (Package on Package) and the like.

Further, transistors of the present invention are field-effect transistors (FETs) including various transistors such as not only MOS (Metal Oxide Semiconductor) transistors but also MIS (Metal-Insulator Semiconductor) transistors, TFT (Thin Film Transistor) and the like. Further, the device of the invention may include bipolar transistors. Furthermore, an N-channel type transistor (NMOS transistors) is a typical example of a first conductive type transistor, and a P-channel type transistor (PMOS transistor) is a typical example of a second conductive type transistor.

The present invention can be applied to devices based on various combinations or selections of the disclosure of the embodiments. That is, the present invention covers various modifications which those skilled in the art can carry out in accordance with all disclosures including claims and technical ideas.

The invention claimed is:

1. A semiconductor device that comprises a hierarchical bit line structure comprising:
   a first local bit line transmitting a first signal of a first memory cell corresponding to a selected word line;
   a first global bit line electrically connected to the first local bit line through a first switch;
   a first sense amplifier electrically connected to the first global bit line;
   a second local bit line transmitting a second signal of a second memory cell corresponding to the selected word line;
   a second global bit line electrically connected to the second local bit line through a second switch;
   a second sense amplifier electrically connected to the second global bit line; and
   a control circuit controlling the first and second sense amplifiers and the first and second switches,
   wherein, during a first period after the first and second memory cells are simultaneously accessed by activating the selected word line, the control circuit controls the first switch to a conduction state and controls the first sense amplifier to an active state so that the first sense amplifier amplifies the first signal and controls the second switch to a non conduction state, and
   during a second period after sensing of the first sense amplifier finishes in the first period, the control circuit controls the second switch to a conduction state and controls the second sense amplifier to an active state so that the second sense amplifier amplifies the second signal.

2. The semiconductor device according to claim 1 further comprising:
   a first potential supply circuit supplying a fixed potential to the first global bit line; and
   a second potential supply circuit supplying the fixed potential to the second global bit line,
   wherein the control circuit activates the second potential supply circuit during the first period, deactivates the first potential supply circuit during the first and second periods, and activates the first potential supply circuit corresponding to deactivating the first sense amplifier.

3. The semiconductor device according to claim 1 further comprising a memory cell array including M global bit lines extending in a first direction,
   wherein the M global bit lines include the first and second global bit lines that are alternately arranged in a second direction that perpendicular to the first direction, and
   the first sense amplifier is arranged at one end in the first direction and the second sense amplifier is arranged at another end opposite to the one end.

4. The semiconductor device according to claim 3,
   wherein the memory cell array includes M×N local bit lines extending in the first direction,
   N first local bit lines and N first switches that are partitioned along the first direction are arranged in association with each of the first global bit lines, the N first switches being connected to each ones of the first global bit lines, and
   N second local bit lines and N second switches that are partitioned along the first direction are arranged in association with each of the second global bit lines, the N second switches being connected to each ones of the second global bit lines.

5. The semiconductor device according to claim 4,
   wherein the first sense amplifier is configured in an open bit line structure in which the potential of the first global bit line included in a second memory cell array is sensed using the potential of the first global bit line included in a first memory cell array as a reference,
   the second sense amplifier is configured in an open bit line structure in which the potential of the second global bit line included in the second memory cell array is sensed using the potential of the second global bit line included in a third memory cell array as a reference,
   the second memory cell array is located between the first and third memory cell arrays,
   and the second memory cell array is accessed with the first and the third memory cell arrays exclusively.

6. The semiconductor device according to claim 4 further comprising:
   a single-ended first local sense amplifier arranged between one end of the first local bit line and the first switch, the first local sense amplifier having a gate terminal of a transistor connected to the first local bit line, and
   a single-ended second local sense amplifier arranged between one end of the second local bit line and the second switch, the second local sense amplifier having a gate terminal of a transistor connected to the second local bit line.

7. The semiconductor device according to claim 6,
   wherein the first sense amplifier is a single-ended first global sense amplifier having a gate terminal of a transistor connected to the first global bit line,
   the second sense amplifier is a single-ended second global sense amplifier having a gate terminal of a transistor connected to the second global bit line,
   and each of the first and second global sense amplifiers is shared by the first and second global bit lines belonging to two adjacent memory cell arrays on both sides, respectively.

8. The semiconductor device according to claim 1 further comprising:
a first input/output line;
a second input/output line;
a first column select circuit selectively connecting the first sense amplifier to the first input/output line in accordance with a column select line and a first select signal; and
a second column select circuit selectively connecting the second sense amplifier to the second input/output line in accordance with the column select line and a second select signal, the first and second select signals being related to operations of the first and second switches.

9. The semiconductor device according to claim 1, further comprising a memory bank being configured by aligning a plurality of memory cell arrays,
wherein one word line among a plurality of word lines included in a first memory cell array and one word line among a plurality of word lines included in a second memory cell array are simultaneously activated as the selected word line, the first and second memory cell arrays being among the plurality of memory cell arrays.

10. The semiconductor device according to claim 9,
wherein two word lines corresponding to row addresses of which a predetermined bit is different from each other are simultaneously activated, each of the row addresses designating the selected word line, the two word lines being the one word line of the first memory cell array and the one word line of the second memory cell array, and
the control circuit activates one of the first and second sense amplifiers during the first period and activates the other thereof during the second period, in response to the predetermined bit of the row addresses.

11. The semiconductor device according to claim 1, wherein the first and second global bit lines are physically adjacent to each other.

12. The semiconductor device according to claim 11, wherein the first and second local bit lines are physically adjacent to each other.

13. A control method of a semiconductor device, the method comprising:
accessing first and second memory cells simultaneously using one word line in a first period;
transmitting data of the first memory cell to a first local bit line and transmitting the data of the first memory cell to a first global bit line through the first local bit line, and transmitting data of the second memory cell to a second local bit line and not transmitting the data of the second memory cell to a second global bit line corresponding to the second local bit line, in a second period after the first period;
sensing the data of the first memory cell using a first sense amplifier through the first global bit line in a third period after the second period;
transmitting the data of the second memory cell to the second global bit line through the second local bit line in a fourth period after the third period; and
sensing the data of the second memory cell using a second sense amplifier through the second global bit line in a fifth period after the fourth period,
wherein the first and second local bit lines, the first and second global bit lines and the first and second sense amplifiers are objects becoming independent from each other, respectively.

14. The control method according to claim 13, wherein the first amplifier continues to be active in the fourth and fifth periods.

15. The control method according to claim 13,
wherein the second global bit line is maintained at a predetermined potential in the second and third periods,
and the second global bit line is released from the predetermined potential in the forth period.

16. The control method according to claim 13 further comprising rewriting data of the first memory cell in a sixth period after the fifth period.

17. The control method according to claim 16 further comprising rewriting data of the second memory cell in the sixth period.

18. The control method according to claim 13,
wherein, in the second period, the data of the first memory cell is sensed by a third amplifier through the first local bit line and the sensed data is transmitted to the first global bit line as the data of the first memory cell, and the data of the second memory cell is sensed by a fourth amplifier through the second local bit line,
and, in the fourth period, the sensed data by the fourth amplifier is transmitted to the second global bit line as the data of the second memory cell.

19. The control method according to claim 13,
wherein, in the second period, the data of the first memory cell is sensed by a third amplifier through the first local bit line and the sensed data is transmitted to the first global bit line as the data of the first memory cell, and,
in the fourth period, the data of the second memory cell is sensed by a fourth amplifier through the second local bit line and the sensed data is transmitted to the second global bit line as the data of the second memory cell.

20. The control method according to claim 19,
wherein, in the second period, the sensing of a third amplifier and the transmitting to the first global bit line are synchronized at a time with each other,
and, in the fourth period, the sensing of the fourth amplifier and the transmitting to the second global bit line are synchronized at a time with each other.

* * * * *